(12) United States Patent
Ishii

(10) Patent No.: US 9,047,962 B2
(45) Date of Patent: Jun. 2, 2015

(54) SEMICONDUCTOR MEMORY DEVICE AND CONTROL METHOD OF THE SAME

(71) Applicant: Kabushiki Kaisha Toshiba, Tokyo (JP)

(72) Inventor: Hiroyuki Ishii, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 13/786,003

(22) Filed: Mar. 5, 2013

(65) Prior Publication Data

US 2014/0071765 A1 Mar. 13, 2014

(30) Foreign Application Priority Data

Sep. 7, 2012 (JP) ................. P2012-197306

(51) Int. Cl.
*G11C 16/34* (2006.01)
*G11C 16/10* (2006.01)
*G11C 16/12* (2006.01)
*G11C 16/14* (2006.01)
*G11C 16/04* (2006.01)

(52) U.S. Cl.
CPC ............... *G11C 16/12* (2013.01); *G11C 16/14* (2013.01); *G11C 16/3459* (2013.01); *G11C 16/3454* (2013.01); *G11C 16/0483* (2013.01); *G11C 16/10* (2013.01)

(58) Field of Classification Search
CPC .............. G11C 16/10; G11C 16/0483; G11C 11/5628; G11C 16/3454; G11C 16/3459
USPC ............................ 365/185.19, 185.22, 185.23
See application file for complete search history.

(56) References Cited

U.S. PATENT DOCUMENTS

| 5,539,680 | A | 7/1996 | Palnitkar et al. |
| 5,596,526 | A | 1/1997 | Assar et al. |
| 5,757,699 | A | 5/1998 | Takeshima et al. |
| 5,892,710 | A | 4/1999 | Fazio et al. |
| 6,028,792 | A | 2/2000 | Tanaka et al. |
| 6,507,518 | B2 | 1/2003 | Hosono et al. |
| 7,073,103 | B2 | 7/2006 | Gongwer et al. |
| 7,602,650 | B2 * | 10/2009 | Jung et al. ................ 365/185.22 |
| 7,948,804 | B2 | 5/2011 | Komatsu |
| 8,223,557 | B2 | 7/2012 | Komatsu |
| 2004/0027901 | A1 | 2/2004 | Shiga et al. |
| 2004/0156239 | A1 | 8/2004 | Funaki |
| 2005/0083737 | A1 | 4/2005 | Okimoto et al. |
| 2006/0083073 | A1 | 4/2006 | Ueda |

(Continued)

FOREIGN PATENT DOCUMENTS

| JP | 2000-163978 | 6/2000 |
| JP | 2001-093287 | 4/2001 |

(Continued)

*Primary Examiner* — Ly D Pham
(74) *Attorney, Agent, or Firm* — Patterson & Sheridan, LLP

(57) ABSTRACT

A semiconductor memory device includes a plurality of memory cells and a control circuit configured to apply a program voltage of an initial level to a control electrode of a selected memory cell and then of an increased level a number of times, each time without decreasing the program voltage applied to the control electrode, prior to executing a program verifying operation on the selected memory cell. In addition, the control circuit may further be configured to apply an erase voltage of an initial level to a control electrode of a selected memory cell and then of an increased level a number of times, each time without decreasing the erase voltage applied to the control electrode, prior to executing an erase verifying operation on the selected memory cell.

25 Claims, 15 Drawing Sheets

(56) References Cited

U.S. PATENT DOCUMENTS

| | | |
|---|---|---|
| 2007/0234144 A1 | 10/2007 | Gongwer et al. |
| 2007/0297236 A1 | 12/2007 | Tokiwa |
| 2008/0101126 A1* | 5/2008 | Hemink et al. .......... 365/185.19 |
| 2008/0198659 A1 | 8/2008 | Honma et al. |
| 2010/0008145 A1* | 1/2010 | Wang ..................... 365/185.19 |
| 2010/0195387 A1* | 8/2010 | Park ........................ 365/185.03 |
| 2011/0032757 A1* | 2/2011 | Dutta et al. .............. 365/185.02 |
| 2011/0310671 A1* | 12/2011 | Lee et al. ................. 365/185.19 |
| 2012/0127800 A1* | 5/2012 | Lutze et al. .............. 365/185.19 |

FOREIGN PATENT DOCUMENTS

| | | |
|---|---|---|
| JP | 2002-140899 | 5/2002 |
| JP | 2006-509326 | 3/2006 |
| JP | 2006-294128 | 10/2006 |
| JP | 2007-066386 | 3/2007 |
| JP | 2009-533794 | 9/2009 |
| JP | 2010-519673 | 6/2010 |
| JP | 2010-524147 A | 7/2010 |
| WO | 2007076512 | 7/2007 |
| WO | 2008124760 | 10/2008 |

\* cited by examiner

SEMICONDUCTOR MEMORY DEVICE AND CONTROL METHOD OF THE SAME

CROSS-REFERENCE TO RELATED APPLICATION

This application is based upon and claims the benefit of priority from Japanese Patent Application No. 2012-197306, filed Sep. 7, 2012; the entire contents of which are incorporated herein by reference.

FIELD

Embodiments described herein relate generally to a semiconductor memory device and a control method for the semiconductor memory device.

BACKGROUND

During a writing operation in a NAND-type flash memory, electrons are injected into a floating-gate from the substrate through a tunnel insulating film, due to the FN (Fowler Nordheim) tunnel current. The electrons during this process sometimes cause deterioration of the properties of the tunnel insulating film.

DETAILED DESCRIPTION

Embodiments of the invention provide a high-quality semiconductor memory device which minimizes the effect of deterioration in a tunnel insulating film as a result of electrons moving in and out of a charge storage layer of a memory cell.

In general, the embodiments will be described in detail using references to the figures. Here, the same notations are made for the construction elements with the same function or structure. Duplicate explanations will be used only when necessary. Also, each embodiment explained in the following is an example of devices and methods to embody the technological principles of the embodiment. The technological principles do not specify materials, shapes, constructions and arrangements of the construction parts. As a result, the technological principles of the embodiments can be altered in various ways within the scope of the patent application.

A semiconductor memory device according to an embodiment includes a plurality of memory cells and a control circuit configured to apply a program voltage of an initial level to a control electrode of a selected memory cell and then of an increased level a number of times, each time without decreasing the program voltage applied to the control electrode, prior to executing a program verifying operation on the selected memory cell. In addition, the control circuit may further be configured to apply an erase voltage of an initial level to a control electrode of a selected memory cell and then of an increased level a number of times, each time without decreasing the erase voltage applied to the control electrode, prior to executing an erase verifying operation on the selected memory cell.

First Embodiment

<1.1 Structure>
<1.1.1 Overall Structure of NAND-Type Flash Memory>

Figure 1:
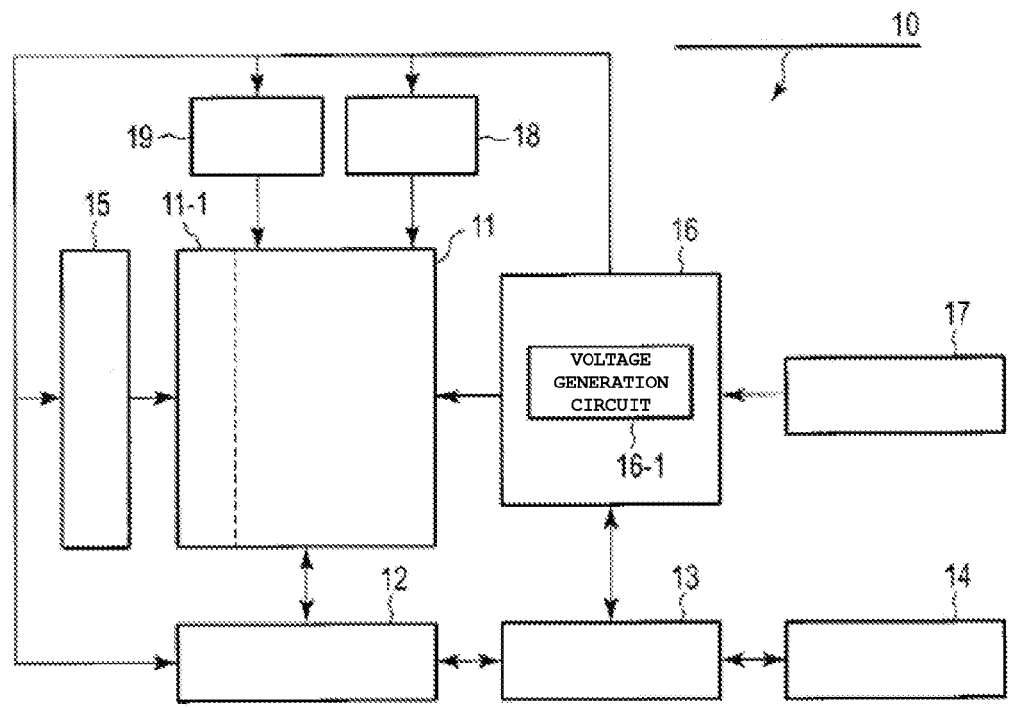
FIG. 1 is a block drawing, schematically showing a basic structure of a NAND-type flash memory according to a first embodiment.

The structure of the NAND-type flash memory of the first embodiment will be explained with reference to FIG. 1. FIG. 1 is a block drawing, schematically showing a basic structure of NAND-type flash memory 10 of the first embodiment.

As shown in FIG. 1, a NAND-type flash memory 10 is equipped with a memory cell array 11, a column decoder 12, a data input/output buffer 13, a data input/output terminal 14, a row decoder 15, a control circuit 16, a control signal input terminal 17, a source line control circuit 18, and a well control circuit 19.

Memory cell array 11 includes multiple bit lines BL, multiple word lines WL, and source line SL. This memory cell array 11 is composed of multiple blocks BLK, in which memory cell transistors (also referred to as memory cells) MT that can be electrically rewritten, are arranged in the form of matrix. Each memory cell transistors MT, for example, has a layered gate, which includes a control electrode and an electric charge accumulation layer (for example, a floating gate electrode), and stores binary or multi-valued data, depending on the change in the threshold value of the transistor determined by the amount of electric charge injected into the float gate electrode. Also, each memory cell transistor MT can have the MONOS (Metal-Oxide-Nitride-Oxide-Silicon) structure, which traps electrons in the nitride film.

The ROM fuse area (also called the fuse area) 11-1, which is the specified area on Memory cell array 11, stores various preset values necessary for the initialization of memory 10 and others. During the power-up (power-on) period for memory 10, the various preset values stored within ROM fuse area 11-1 are automatically read by control circuit 16. The various preset values stored within ROM fuse area 11-1 are, for example, voltage set data, the number of continuous applications (also called the preset value and so on) of the program voltage used during the write operation or erase voltage used during the erase operation, and others. The initialization of memory 10 is executed by control circuit 16 reading these various preset values automatically. The voltage set data refer to the pulse width and the pulse height of the pulse voltage for the write and erase operations. Control circuit 16 generates voltage in voltage generation circuit 16-1 according to these voltage set data, etc. ROM fuse area 11-1 can also store the number of step-ups for the number of write and erase operations.

The column decoder 12 has a sense amplifier (not shown), which sense-amplifies the voltage of bit line BL within the memory cell array 11; a data memory circuit (not shown), which is used to latch the data to execute the write operation; and so on. The column decoder 12 reads data of the memory cell within the memory cell array 11 through bit line BL, detects the state of the memory cell through bit line BL, and writes data into the memory cell by applying the write control voltage to the memory cell.

Also, the column decoder 12 selects a data memory circuit within column decoder 12, and outputs the data of memory cell to the external part (host) from data output/input terminal 14 through data input/output buffer 13.

The data input/output buffer 13 receives data from the data output/input terminal 14, which are stored in the data memory circuit selected by the column decoder 12. Also, the data input/output buffer 13 outputs data to the external part through data input/output terminal 14.

In addition to the write data, the data input/output terminal 14 receives commands and addresses such as write, read, erase and status lead.

The row decoder 15 selects block BLK during the read, write or erase operation of data and designates other blocks BLK as unselected. In other words, the row decoder 15 applies necessary voltage for the read, write or erase operation to word line WL and select gate lines SGS and SGD of memory cell array 11.

The source line control circuit 18 is connected to the memory cell array 11. The source line control circuit 18 controls the voltage of source line SL.

The well control circuit 19 is connected to the memory cell array 11. This well control circuit 19 is to control the voltage of the semiconductor substrate (well), on which memory cell transistor MT is formed.

The control circuit 16 controls the memory cell array 11, ROM fuse area 11-1, column decoder 12, data input/output buffer 13, row decoder 15, source line control circuit 18 and well control circuit 19. The control circuit 16 includes, for example, voltage generation circuit 16-1, which increases the power source voltage. Control circuit 16 increases the power voltage, as necessary, by the voltage generation circuit 16-1 and applies the increased voltage to column decoder 12, data input/output buffer 13, row decoder 15, and source line control circuit 18.

The control circuit 16 conducts control operations, based on the control signals (such as command latch enable signal (CLE), address latch enable signal (ALE), and ready/busy signal (RY/BY)), which are input from the outside through the control signal input terminal 17; the commands are input from data input/output terminal 14 through data input/output buffer 13. In other words, control circuit 16 generates desired voltages for the program, verification operations, read and erase operations of data based on the control signals and commands, and supplies each part of memory cell array 11 with them.

<1.1.2 Overview of Memory Cell Array>

Figure 2:
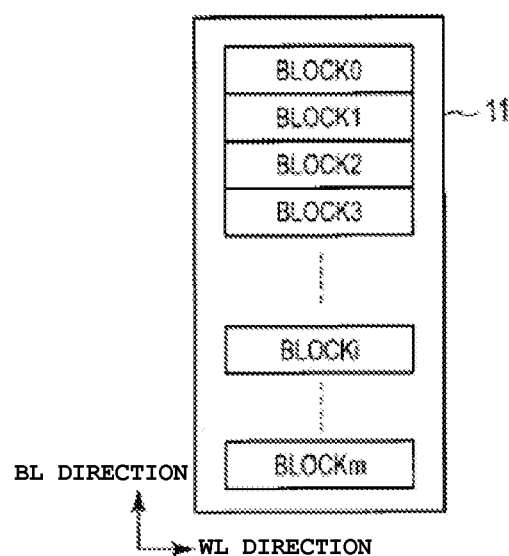
FIG. 2 is a block drawing, schematically showing the basic structure of the memory cell array of the first embodiment.
Figure 3:
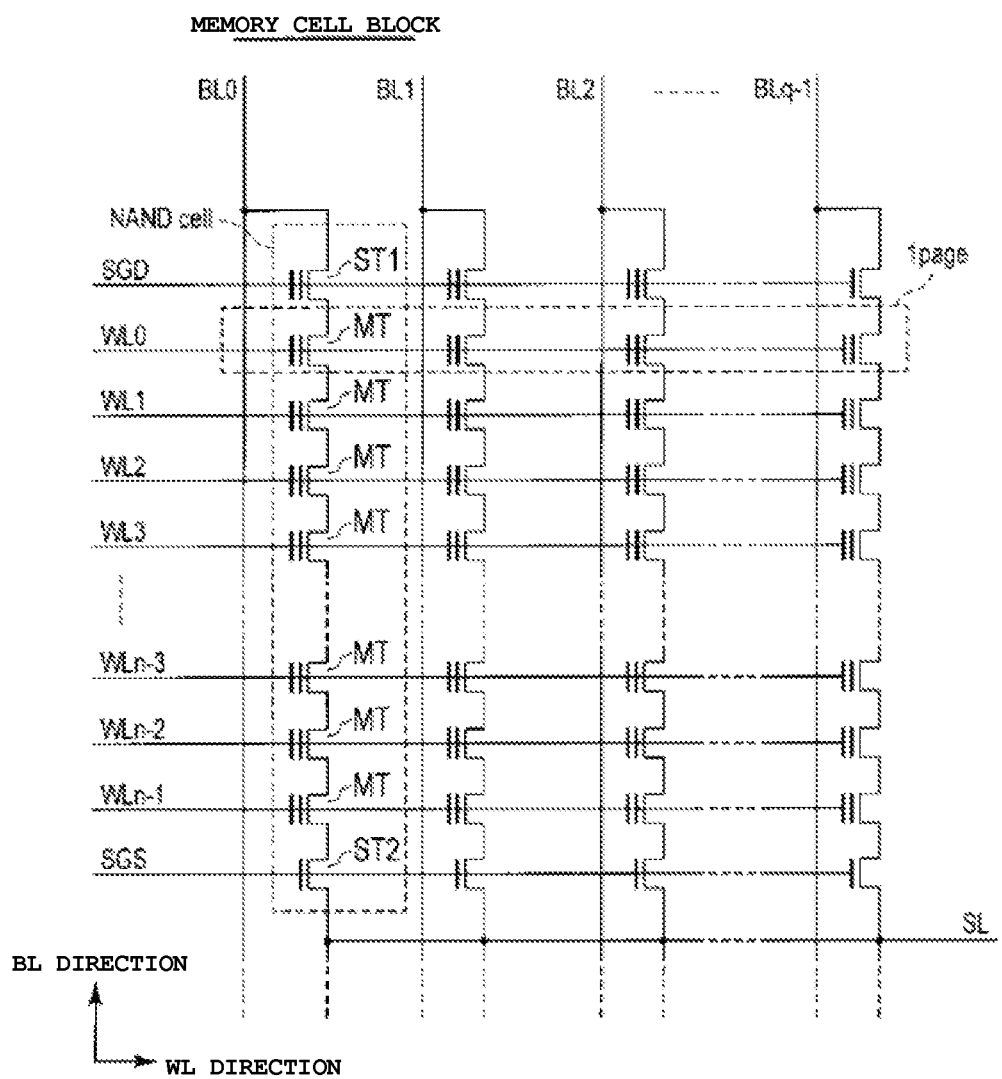
FIG. 3 is a circuit map of an exemplary circuit of one memory block among the multiple memory blocks shown in FIG. 2.

Next, the basic structure of memory cell array 11 of the first embodiment will be explained. FIG. 2 is a block drawing, schematically showing the basic structure of memory cell array 11 of this embodiment. FIG. 3 shows a circuit example of one memory block BLK out of multiple memory blocks shown in FIG. 2 (BLOCK 0-BLOCK M).

As shown in FIG. 2, the memory cell array 11 is composed of multiple memory blocks BLOCK 1 through BLOCK m (m is an integer 1 one greater.) The multiple blocks BLOCK 1 through BLOCK m are arranged along the direction of bit line BL (in a column orientation).

As shown in FIG. 3, one memory block includes multiple NAND cells (also called a cell unit, NAND strings, and so on), which are lined up along the direction of word line WL (in a row orientation).

One NAND cell includes multiple memory cell transistors (also referred to as memory cells) MT, connected in series; a select gate transistor ST1, connected to the drain of memory cell transistor MT at one end; and a select gate transistor ST2, connected to the source of the memory cell at the other end.

The memory cell transistor MT has an electric charge accumulation layer, which is formed on the semiconductor substrate with a gate insulating film in between, a gate insulating film, which is formed on the electric charge accumulation layer, and a control gate electrode, which is formed on the gate insulating film. Here, the number of memory cell transistors MT is not limited to eight. It can be 16, 32, 64, 128, 256, and so on, and is, therefore, not restricted. Also, adjacent memory cell transistors MT share the source and the drain and are arranged in such a way as the current flow between the select gate transistors ST1 and ST2 is in a serial connection. The drain area at one end of the serially connected memory cell transistors MT is connected to the source area of select gate transistor ST1, and the source area at the other end is connected to the drain area of select gate transistor ST2.

The bit lines BL 0 through BL q−1 (q is an integer of 1 or greater) are connected to the drains of select gate transistor ST1 respectively. Source line SL is connected to the source of select gate transistor ST2. Here, regarding bit lines BL0 through BL q−1, when it is not necessary to distinguish them, they will be referred to as bit line BL. Also, it is not always necessary to have both select transistors ST1 and ST2. Only one can be utilized as long as it is possible to select NAND cells.

Word lines WL0 through WL n−1 (n is an integer of 1 or greater) extend in the WL direction and are jointly connected by adjacent memory cells lined up in the WL direction. Here, to simplify the explanation, word lines WL0 through WL n−1 will be referred to simply as word line WL if it is not necessary to distinguish the lines from each other.

Each of select gate lines SGD and SGS is jointly connected at the gate electrodes of select transistors ST1 and ST2 of the memory cell.

Also, into the multiple memory cell transistors MT connected to the same word line WL, data are written all together. This unit is called the page. Furthermore, at multiple NAND cells on the same row, data are erased all together. This unit is called the memory block.

Next, the plane figure of memory cell array 11 with the structure previously described will be explained using FIG. 4.

Figure 4:
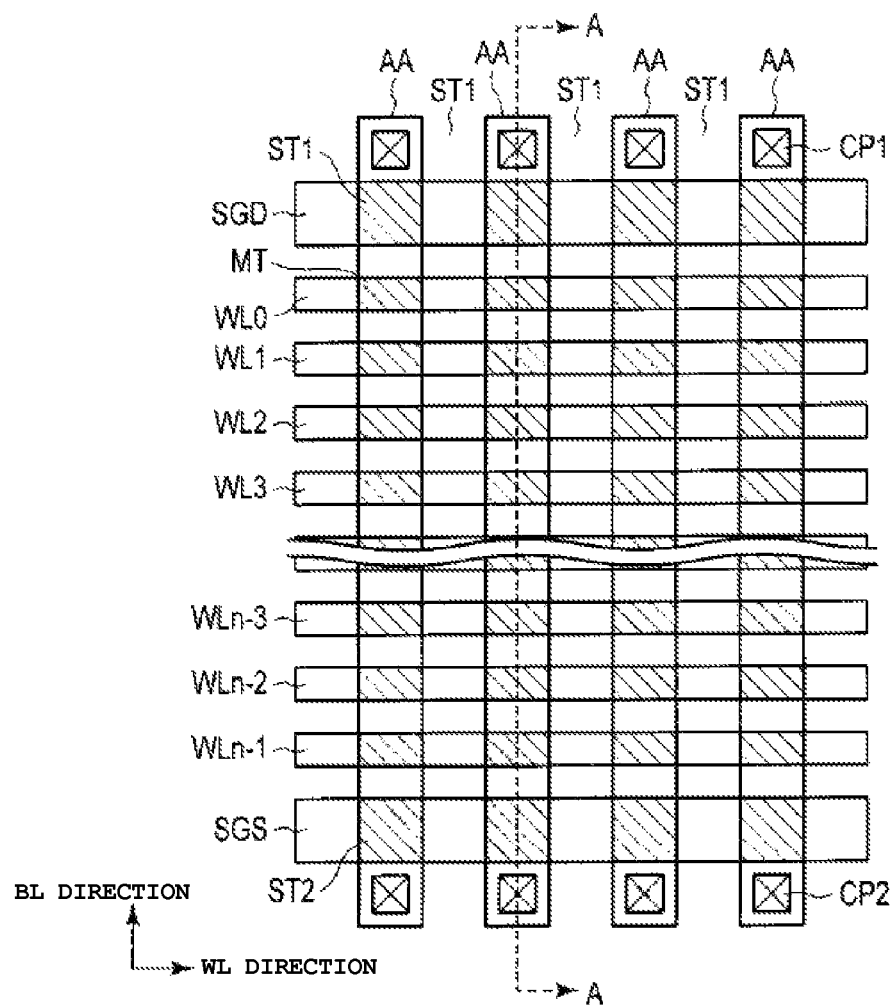
FIG. 4 is a plan view, schematically showing the basic construction of the memory cell array of according to the first embodiment.

As shown in FIG. 4, in the p-type semiconductor substrate, multiple element areas AA (active area) that are formed in strips (layers) are provided along the direction of word line WL, which is perpendicular to the direction of bit line BL. Between the adjacent element areas AA, element isolation areas ST1 (shallow trench isolation) are formed extending in the direction of bit line BL; by this element isolation area ST1, element areas AA are electrically separated.

On the semiconductor substrate, word line WL and select gate lines SGD and SGS that are layered are formed adjacent multiple element areas AA along the direction of word line WL. In the area where word line WL and element area AA intersect, a memory cell transistor MT is formed. In the areas where select gate lines SGD and SGS and element areas AA intersect, selection transistors ST1 and ST2 are formed, respectively.

In element areas AA between the word lines WL adjoining in the direction of the bit line BL, between the select gate lines, and between the word line WL and the select gate line, an impurity diffusion layer, which is to be used as a source area or drain area for the memory cell transistor MT and select transistors ST1 and ST2, is formed.

The impurity diffusion layer, which is formed in the element area AA between the select gate lines SGD adjoining in the direction of the bit line BL, functions as a drain area for select transistor ST1. On this drain area, a contact plug CP1 is formed. The contact plug CP1 is connected to the bit line BL in a layer formed in the direction of bit line BL (not shown).

Also, the impurity diffusion layer, which is formed in the element area AA between the select gate lines SGS adjoining in the direction of bit line BL, functions as a source area for the select transistor ST2. On this source area, a contact plug CP2 is formed. The contact plug CP2 is connected to the source line SL, which is not shown in the figure.

Figure 5:
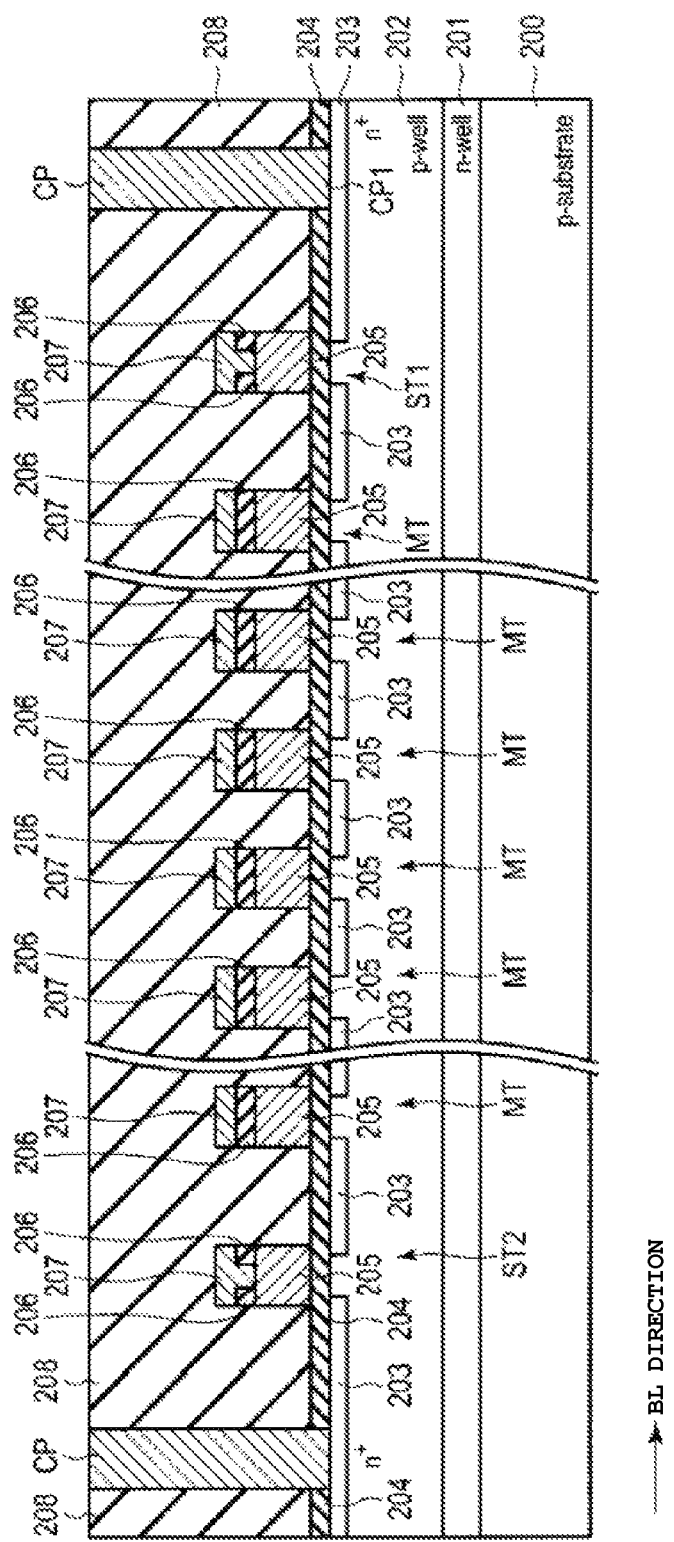
FIG. 5 is a cross section of FIG. 4 along the A-A line.

Next, the cross section of the memory cell array 11 with the structure previously described will be explained with reference to FIG. 5. FIG. 5 shows the cross section of FIG. 4 along the A-A line.

As shown in FIG. 5, in the surface of a p-type semiconductor substrate (p-substrate) 200, an n-type well (n-well) 201 is formed. Furthermore, on the n-type well area 201, a p-type well (p-well) 202 is formed. Here, the p-type semiconductor substrate 200, the n-type well area 201, and the p-type well area 202 can also be simply called semiconductor substrates 200 through 202.

On the active area AA (FIG. 4) of the p-type well area 202, the component that functions as a tunnel insulating film 204, for example a silicon oxide film, is formed. On the tunnel insulating film 204, a gate structure with a memory cell transistor MT and select transistors ST1 and ST2 is formed. The tunnel insulating film 204 at the memory transistors MT functions as a tunnel film through which electrons are tunneled.

The gate structure of memory cell transistor MT has a layered structure. In other words, it is provided with an electrode film 205 formed on the tunnel insulating film 204, an insulating film 206 formed on the electrode film 205, and an electrode 207 formed on the insulating film 206. The electrode film 205 functions as an electric charge accumulation layer that accumulates electric charges. Insulating film. 206 works to contain electric charges in electrode film 205. Electrode film. 207 functions as a control gate (word line WL).

In the following, the electrode film 205, insulating film 206 and electrode film 207 of memory cell transistor MT may be referred to as electric charge accumulation film 205, gate insulating film 206, and control gate electrode 207, respectively. Electric charge accumulation film 205 is separated at each memory cell transistor MT. The gate insulating film 206 and control electrode 207 are jointly connected between memory cell transistors MT adjacent along the direction of word line WL. In other words, the control gate electrode film 207 of each memory cell transistor MT is jointly connected between the adjacent active areas AA, aside the adjacent element insulating areas along the direction of word lines.

The gate structure of the select transistors ST1 and ST2 is equipped with the electrode film 205 formed on the tunnel insulating film 204, insulating film 206 formed on part of electrode film 205, and electrode film 207 formed on insulating film 206 and part of electrode film 205. In the structure of the select transistors ST1 and ST2, part of the electrode film 205 is electrically connected to the electrode film 207. Here, as a matter of convenience, the electrode film 207 is also called a gate electrode 207. In the select transistors ST1 and ST2, the gate electrodes 207 that are adjacent along the direction of word line WL are connected with one another. Additionally, gate electrode 207 functions as select gate lines SGS and SGD.

Also, on the surface of the p-type semiconductor substrate 200 located between the gate electrodes, an n+-type impurity diffusion layer 203 is formed. N+-type impurity diffusion layer 203 is shared by the adjacent transistors and functions as a source (S) or a drain (D). The area between the adjacent source and drain (i.e., the area directly under the gate electrode) functions as a channel area, which becomes a transfer area for electrons. Memory cell transistor MT and select transistors ST1 and ST2 are formed with these gate electrodes, n+-type impurity diffusion layer 203 and the channel area.

Furthermore, on the p-type semiconductor substrate 200, an interlayer insulating film 208 is formed to cover the memory cell transistor MT and select transistors ST1 and ST2. In the interlayer insulating film 208, contact plug CP2 is formed, which reaches the impurity diffusion layer (source) 203 of the select transistor ST2 on the source side.

Also, in interlayer insulating film 208, contact plug CP1 is formed, which reaches the impurity diffusion layer (drain 203) of the select transistor ST on the drain side.

<1.1.3 On Distribution of Threshold Values of Memory Cell Transistor MT>

Figure 6:
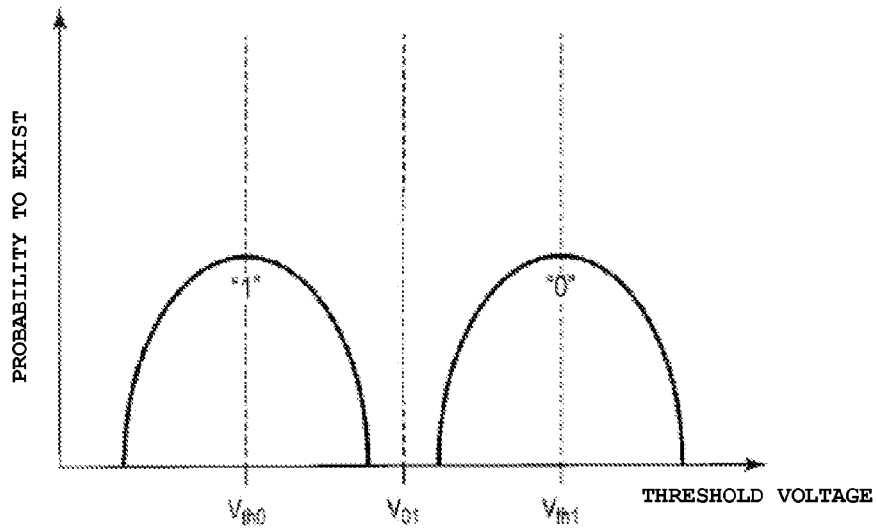
FIG. 6 is a graph, showing a relationship between a threshold value of a memory cell transistor and a probability for existence of the memory cell transistor.

The distribution of threshold values of the memory cell transistor MT will be explained with reference to FIG. 6. In FIG. 6, the threshold values are recorded on the horizontal axis, and the probabilities for existence of memory cell transistor MT are recorded on the vertical axis.

As shown in FIG. 6, each memory cell transistor MT can retain, for example, a datum with 2-levels (one bit of data). In other words, memory cell transistor MT can retain two kinds of data, namely "1" and "0," in the ascending order from the lowest threshold value voltage ($V_{th}$).

The threshold value voltage $V_{th0}$ for data "1" at memory cell transistor MT satisfies $V_{th0} < V_{01}$. The threshold value voltage $V_{th1}$ for data "0" satisfies $V_{01} < V_{th1}$. In this way, memory cell transistor MT can retain one bit of data "0" or data "1," according to the threshold value. This threshold value voltage changes by injecting electric charges into the electric charge accumulation layer or by extracting electric charges from the electric charge accumulation layer.

Additionally, the memory cell transistor MT can be made to hold more than four values. In this embodiment, for example, if memory cell transistor MT holds datum "1," memory cell transistor MT is put in the data erasing state; if memory cell transistor MT holds datum "0," memory cell transistor is put in the data writing state.

<1.2 Write Operation of Semiconductor Memory Device of the First Embodiment>

The write operation of the semiconductor memory device of the first embodiment will be explained in the following. Memory cell transistor MT, connected to the selected word line and the selected bit line (namely, memory cell transistor MT to be programmed), may also be referred to as the selected cell; memory cell transistor MT, connected to the unselected word line or the unselected bit line (namely, memory cell transistor MT not to be programmed), may also be referred to as the unselected cell.

As previously mentioned, the write operation is executed all together to all the memory cell transistors MT that are connected to the same word line (one page). Also, the write operation is executed in the order from the memory cell transistor MT nearest to the select gate line SGS in the memory block in the erase state. In the following, the operation, in which the threshold value of memory cell transistor MT is raised by giving the potential difference between the control gate and the channel to inject an electric charge to the electric charge accumulation layer, is called the "program." By executing this program multiple times, the threshold value of memory cell transistor MT is raised to the desired value, and the write operation is executed. Additionally, to word line WL to which the selected cell belongs, the program voltage is applied multiple times. As explained later, this program voltage becomes incrementally greater corresponding to the number of voltage applications as the applications are repeated. In the following, when the program voltages are not distinguished, it will be simply called program voltage $V_{PGM}$.

Figure 7:
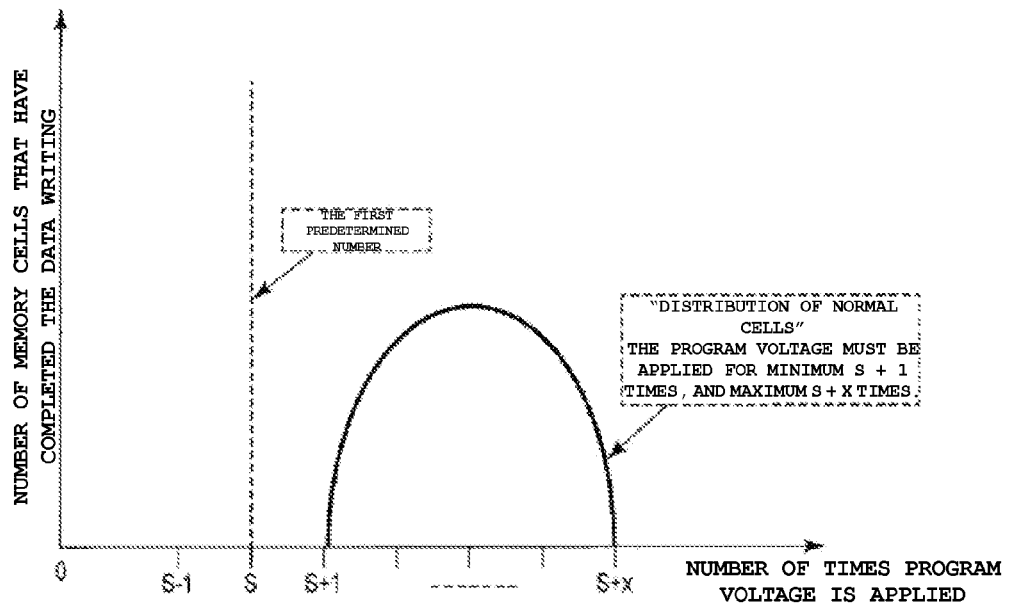
FIG. 7 is a graph, showing a relationship between the number of applications of program voltage and the memory cell whose write operation is completed by the application of the program voltage.

Here, the semiconductor memory device of this embodiment executes the write operation in advance, in the case of a certification examination, etc. As shown in FIG. 7, if control circuit 16 executes the write operation to a normal memory cell, the smallest counts for which data are written into a normal cell will be S+1, and the largest counts will be S+x (x is an integer of 1 or greater). In this case, ROM fuse area 11-1 stores the number of programs insufficient for data to be written into a normal cell as the first preset count (write loop count). According to this embodiment, ROM fuse area 11-1 stores S, which is one count less than the least count (s) for data to be written into a normal cell, as the first preset count. Here, the first preset count is basically the number of programming counts insufficient for data to be written into a normal memory cell. However, for example, the first preset count can be the smallest count at which data are written into a normal memory cell.

Furthermore, the bit line, to which memory cell transistor MT to be programmed is connected, is the selected bit line. The bit line, to which memory cell transistor MT does not need to be programmed because, for example, the threshold value has already risen to the desired value and so on, is connected, is called the unselected bit line.

Figure 8:
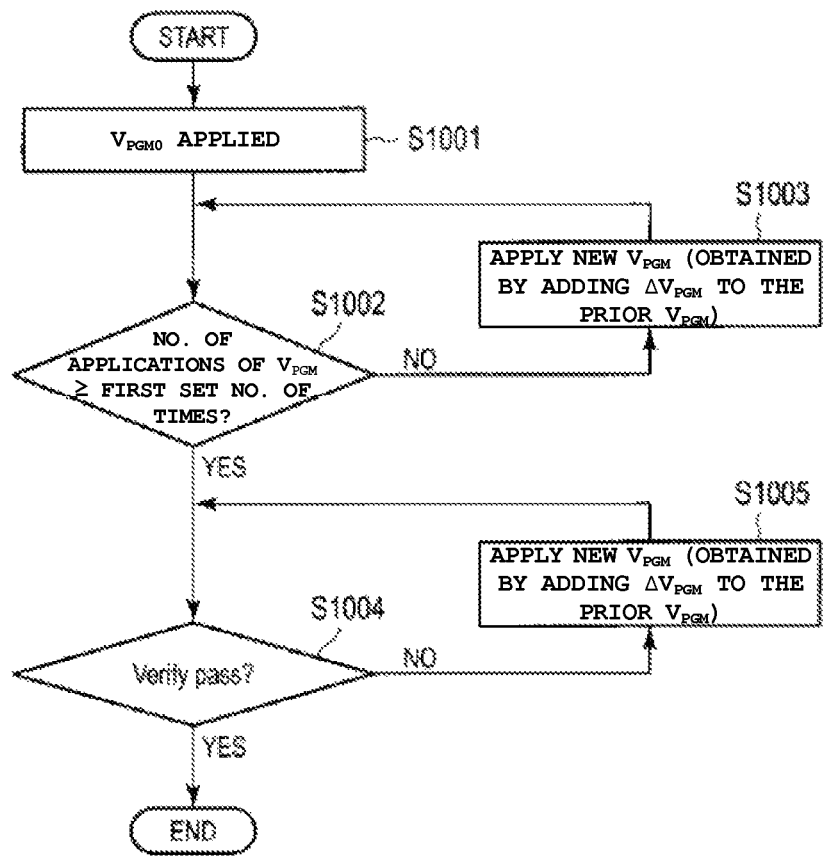
FIG. 8 is a flow chart, showing a write operation of a NAND-type Flash memory according to this embodiment.
Figure 9:
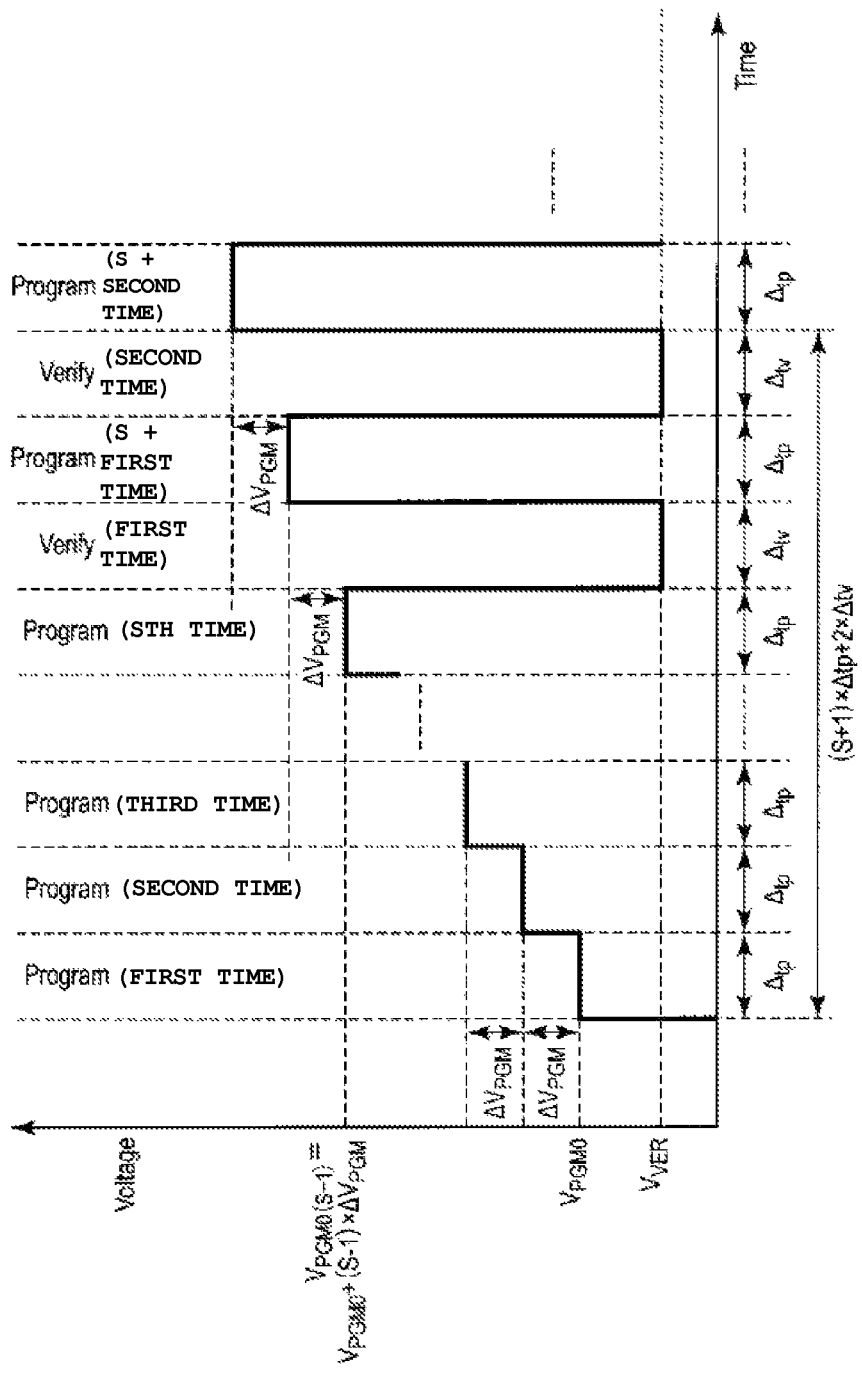
FIG. 9 is a graph, schematically showing an application method of a program voltage of the NAND-type flash memory according to this embodiment.

FIG. 8 is a flow chart of the write operation. The write sequence along with this flow chart is executed based on the control of control circuit 16, which receives the write command from an external part. FIG. 9 is a drawing, schematically showing the program voltage applied to word line WL during the write operation in FIG. 8.

In FIG. 9, each of $V_{PGM0}$ through $V_{PGM(S-1)}$ shows the program voltage for the first through the Sth time. The value of program voltage $V_{PGM0}$ corresponds to the initial value of the program voltage. Also, $\Delta V_{PGM}$ is an increment of the program voltage, which is added to the initial program voltage each time the program is repeated. In this embodiment, $\Delta V_{PGM}$ is set at a constant value, which does not depend on the loop count. This increment $\Delta V_{PGM}$ is added to the program voltage each time the application of the program voltage is repeated. In other words, the program voltage is: Initial program voltage $V_{PGM0}$+increment in voltage $\Delta V_{PGM}\times$(loop count−1).

[Step S1001]

The control circuit 16 applies the first program voltage $V_{PGM0}$ during the period $\Delta tp$ through row decoder 15 to word line WL that belongs to the selected cell (Program (first time)). The amount of this first program voltage $V_{PGM0}$ is stored in ROM fuse area 11-1.

[Step S1002]

Next, the control circuit 16 determines whether or not the number of applications of the program voltage $V_{PGM}$ (also just called the program count) reached the Sth time (the first set count), as set in ROM fuse area 11-1.

[Step S1003]

At step S1002, if the control circuit 16 determines that the program count (for example, X times (X is an integer of 1 or greater)) has not reached the Sth time (S is an integer of 1 or greater), it applies the program voltage $V_{PGMX}(=V_{PGM(X-1)}+\Delta V_{PGM})$ obtained by adding (increasing the voltage for) the increment in the program voltage $\Delta V_{PGM}$ to the program voltage at the Xth time $V_{PGM(X-1)}$ to the selected word line WL, through row decoder 15. After that, control circuit 16 executes step S1002.

[Step S1004]

At step S1002, if the control circuit 16 determines that the program count has reached the Sth time, it then confirms whether or not the threshold value of these memory cells exceeds the write verify voltage. In other words, control circuit 16 executes the verifying operation on the selected cell during period $\Delta tv$. The control circuit 16 determines whether or not data have been written into the selected cell by executing this verifying operation and determining whether it passes or fails. More specifically, control circuit 16 makes the determination by applying the verify voltage $V_{VER}$ to selected word line WL through row decoder 15.

When the threshold value or the memory cell exceeds the verify voltage $V_{VER}$, it terminates the write process. In other words, at step S1004, if control circuit 16 determines through the verifying operation that the selected cell has passed (i.e., determines that data are written into the selected cell), control circuit 16 terminates the write operation to the selected cell.

[Step S1005]

At step S1004, if the control circuit 16 determines by the verifying operation that the selected cell has failed (i.e., determines that data are not written into the selected cell), control circuit 16 applies the program voltage $V_{PGMY}(=V_{PGM(Y-1)}+\Delta V_{PGM})$, obtained by adding (increasing the voltage for) the increment in the program voltage $\Delta V_{PGM}$ to the program voltage for the Yth time (an integer of S or greater) $V_{PGM(Y-1)}$ to selected word line WL through row decoder 15. After that, control circuit 16 executes step S1004.

<1.3 Effects of Write Operation of Semiconductor Memory Device of First Embodiment>

According to the first embodiment, the semiconductor memory device is equipped with a memory portion (memory cell array 11), which has a gate structure, including the first insulating film 204 formed on semiconductor substrate 202, electric charge accumulation layer 205 formed on the first insulating film 204, the second insulating film 206 formed on the electric charge accumulation layer 205, and control electrode 207 formed on the second insulating film 206; and a ROM fuse area 11-1, which is formed inside the memory portion and retains at least the first preset count. Also, the semiconductor memory device is equipped with a control circuit 16, which, when writing data into the memory cell MT selected from multiple memory cells MT, applies the program voltage and is increased incrementally by a specified amount each time according to the number of applications to control electrode 207 of selected memory cell MT until it reaches the first preset count; when the number of applications of the program voltage to control electrode 207 has reached the first preset count, it executes the verifying operation on the selected memory cell MT; and, if it is determined that data are not written into the selected memory cell MT during the verifying operation, it applies the program voltage to control electrode 207.

In this way, the semiconductor memory device explained in the first embodiment skips the verification during the step-up write operation and makes the pulse waveform (the program voltage) into a stage or stepwise form. In other words, during the write operation, it does not conduct the verifying operation until an optional count has been made and executes the program continuously.

The write operation of conventional NAND-type flash memory will be explained using FIG. 10.

Figure 10:
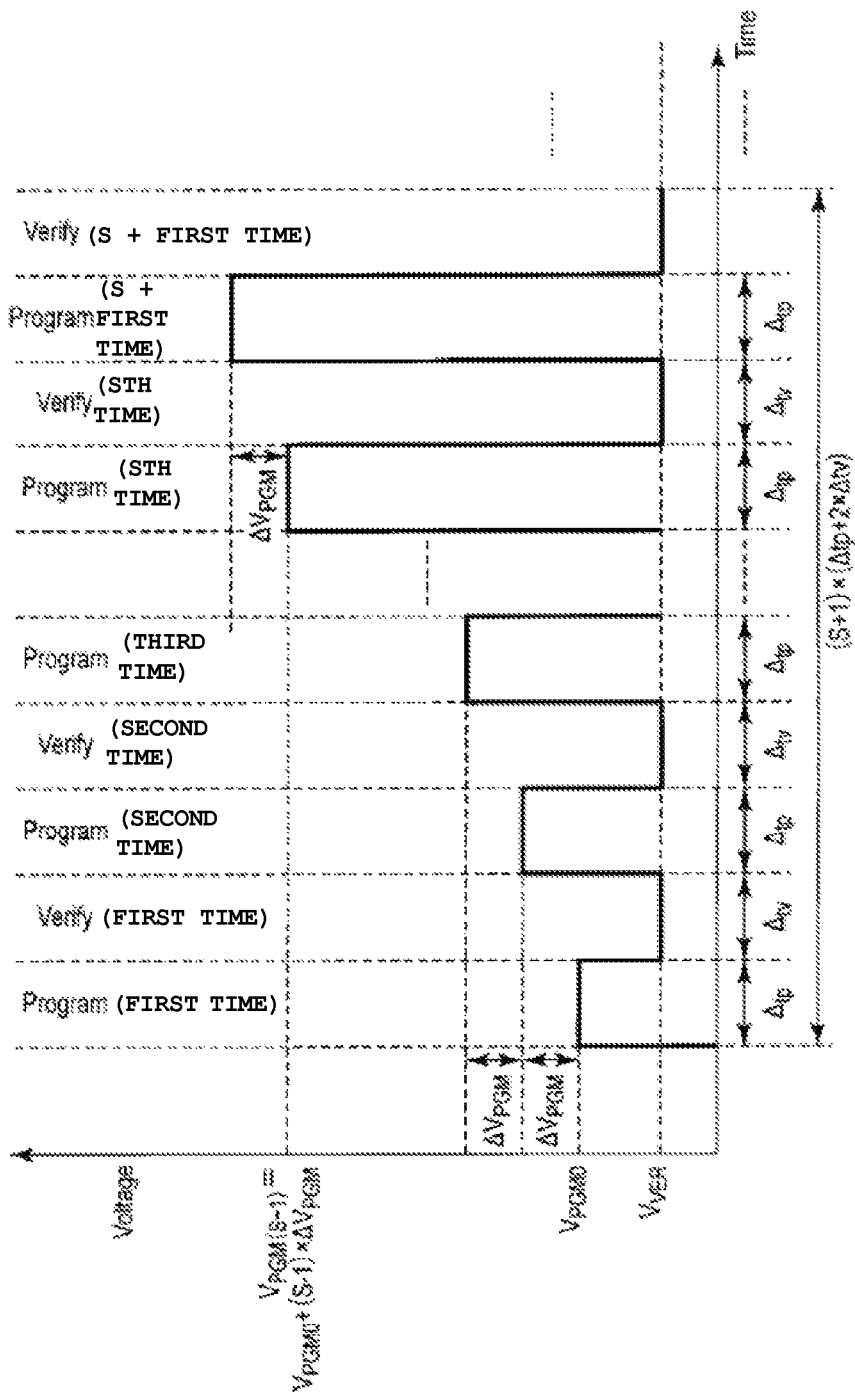
FIG. 10 is a graph, schematically showing an application method of the program of a conventional NAND-type flash memory.

As shown in FIG. 10, during the write operation in the comparative example, the control part repeats the program operation and verifying operation until data are written into the selected cell. Specifically, the control part executes the verifying operation after the first program operation; if it determines that a failure has occurred, it executes the second program operation by using the program voltage (second count) $V_{PGM1}$, obtained by adding $\Delta V_{PGM}$ to the program voltage (first count) $V_{PGM0}$. The control part repeats the operation until it executes the verifying operation and determines that is has passed.

However, in the write operation according to the first embodiment, it is programmed that data are not written into a normal memory cell for S times, so the least counts for data to be written into the selected cell is S+1. As a result, the time needed to complete the data writing into the selected cell at the S+1th program is (S+1)×Δtp+2×Δtv, taking into consideration the verifying operation after the S+1th program (second time). On the other hand, as in the comparative example, if the verifying operation is executed right after each program, the necessary time is (S+1)×(Δtp+Δtv). This is longer by (S−1)×Δtv than the write explained in the first embodiment.

In this way, it is possible to shorten significantly the time needed for the write operation by executing the programs continuously, for the number of times that data are not yet written into a normal cell, and executing the verifying operation after that.

Here, according to the first embodiment, since the duration for the data writing operation can be shortened, it is also possible to execute a more reliable write operation by using the saved time to write slowly by, for example, decreasing the initial write voltage or providing the write voltage in step-up increments.

The time saved with the delayed verifying operation according to the embodiment can be also used for the program operation. For example, it is possible to make the program voltage $V_{PGM0}$, applied to selected word line WL at the beginning of the write operation, less than the program voltage V PRG0 in this embodiment. This may increase the counts needed for the data to be written into a normal memory cell. However, the smaller the program voltage $V_{PGM0}$, the more the damage to tunnel insulating film 204 (see FIG. 5) of memory cell transistor MT can be suppressed.

According to this embodiment, it is also possible to make the value of $\Delta V_{PGM}$ (step-up increments) less than the conventional value. In this case, too, as in the previously described case, the number of programs will increase, but the damage to tunnel insulating film 204 of memory cell transistor MT can be suppressed.

Second Embodiment

The semiconductor memory device according to a second embodiment will be explained. The semiconductor memory device according to the second embodiment is different from the semiconductor memory device of the first embodiment in that it is further equipped with a loop counter to count the number of write and erase operations, and other operations in the memory cell, based on when the first preset count is changed appropriately. Here, duplicative detailed explanations are omitted because the basic structure and method for the write operation are the same as that previously described in the first embodiment.

<2.1 Overall Structure of NAND-Type Flash Memory>

Figure 11:
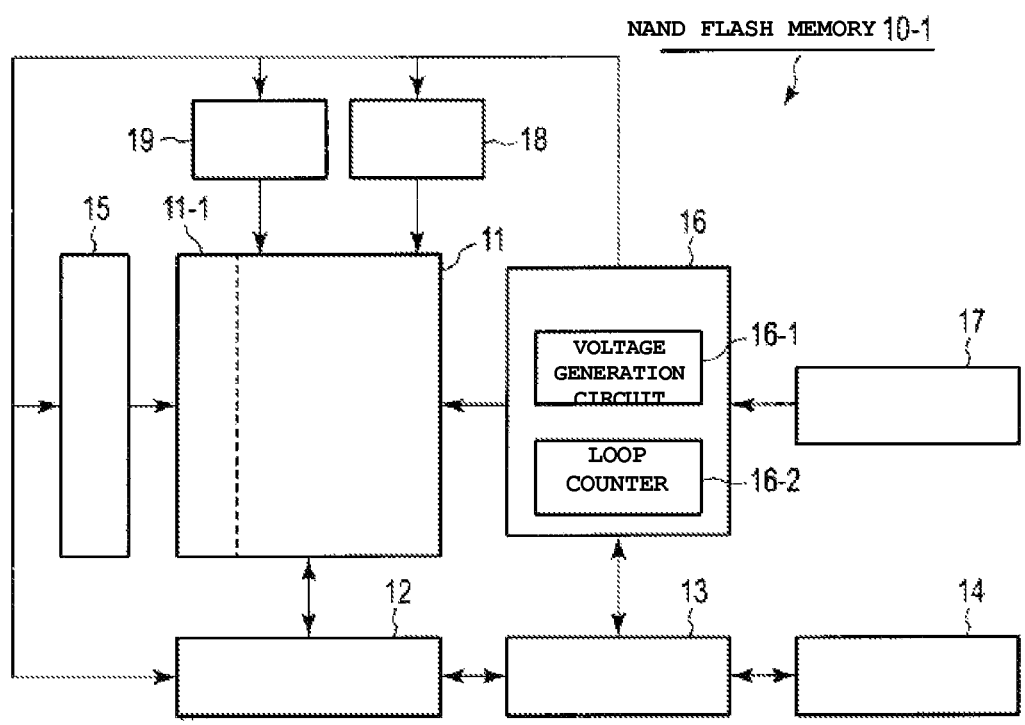
FIG. 11 is a block drawing, schematically showing a basic construction of the NAND-type flash memory according to a second embodiment.

The structure of NAND-type flash memory 10-1 of the second embodiment will be explained with reference to FIG. 11. FIG. 11 is a block drawing, schematically showing the basic structure of NAND-type flash memory 10-1 of the second embodiment.

As shown in FIG. 11, the control circuit 16 is further equipped with loop counter 16-2. Loop counter 16-2 records the number of times that data are written into or erased from memory cell transistor MT and stores the counting results in a specified memory area (for example, memory cell array 11).

Also, in ROM fuse area 11-1, the second preset count, which is to be used by the control circuit 16 during the operation discussed later, is retained. This second preset count is the total number of write or erase operations at which the number of programs needed to write data decreases. This second preset count is delivered in a certification examination of the semiconductor memory device and so on.

<2.2 Write Operation of Semiconductor Memory Device of Second Embodiment>

Figure 12:
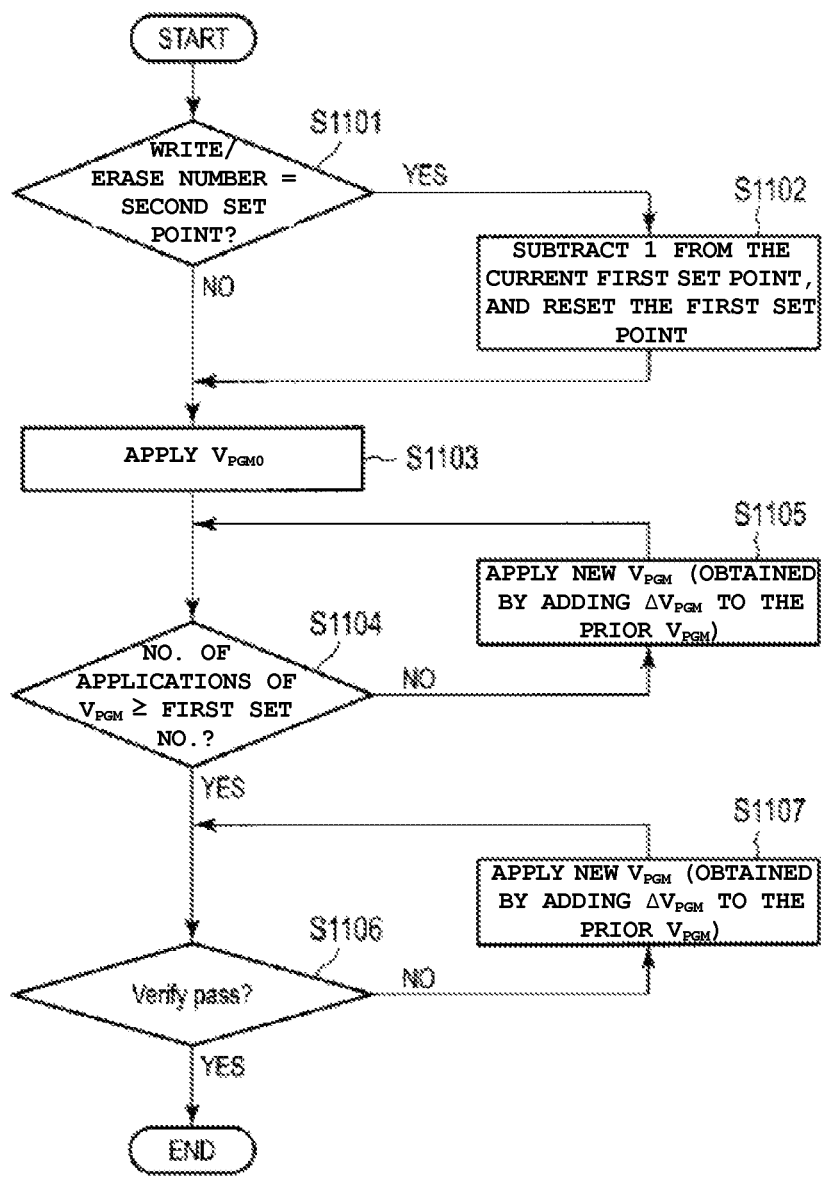
FIG. 12 is a flow chart, schematically showing the write operation of the NAND-type flash memory according to the second embodiment.

The write operation of the semiconductor memory device according to the second embodiment will be explained. FIG. 12 is a flow chart, schematically showing the write operation of the semiconductor memory device of the second embodiment.

[Step S1101]

First, control circuit 16 measures, by using loop counter 16-2, the number of write and erase operations that have been executed so far to the selected cell. Then, control circuit 16 determines whether or not the measured result matches the second preset count, as set in ROM fuse area 11-1.

[Step S1102]

At step S1101, if control circuit 16 determines that the measured result matches the second preset count, as set in ROM fuse area 11-1, control circuit 16 sets the new first preset count, which is obtained by subtracting 1 from the currently used first preset count in ROM fuse area 11-1.

Next, control circuit 16 executes step S1103, using the reset data in ROM fuse area 11-1.

At step S1101, if control circuit 16 determines that the measured result does not match the second preset count, as set in ROM fuse area 11-1, it moves onto step S1103.

[Step S1103] through [Step S1107]

The basic operations are the same as steps S1001 through S1005, as explained in the first embodiment in FIG. 8, so detailed explanations have been omitted.

<2.3 Effects of Semiconductor Memory Device of Second Embodiment>

According to the second embodiment, fuse area 11-1 further retains the second preset count, and when the number of data write and erase operations equals the second preset count, it resets the number obtained by subtracting 1 from the first preset count retained in fuse area 11-1 as the first preset count.

Here, the relationship between the number of write and erase operations and the number of applications of the program voltage which is helpful for the understanding of the effects of the write operation of the semiconductor memory device of the second embodiment will be explained using FIG. 13.

Figure 13:
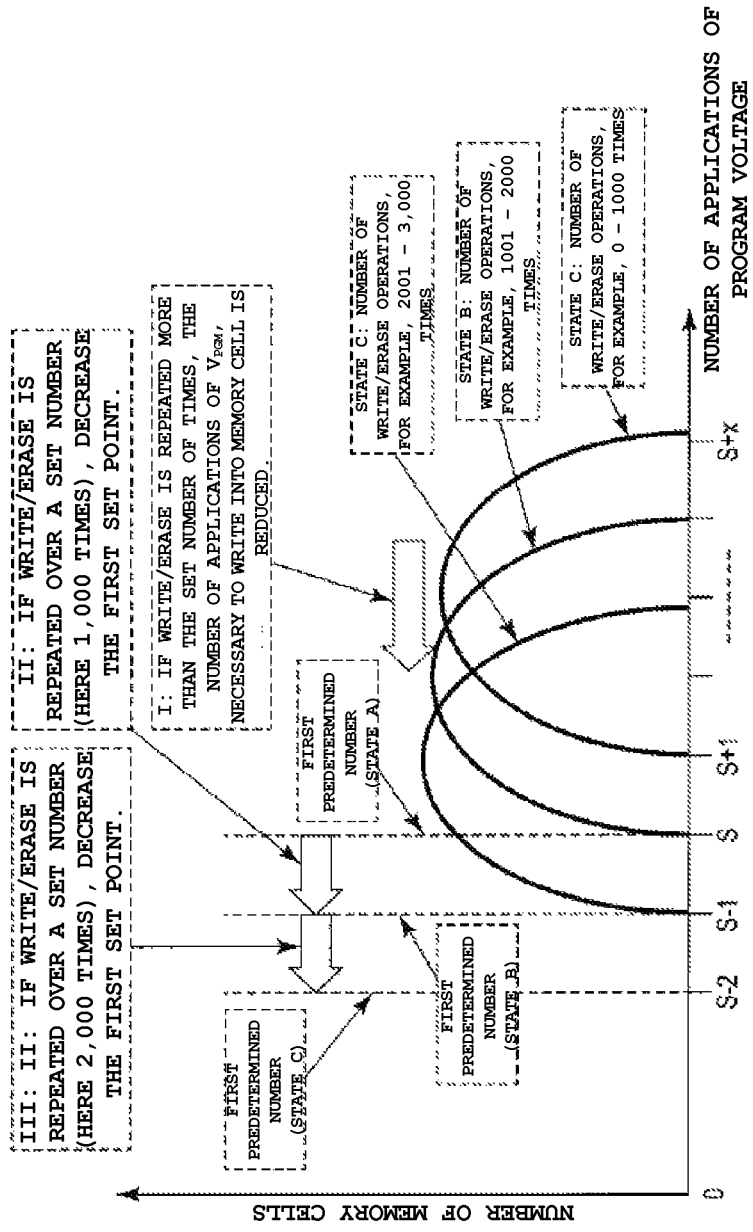
FIG. 13 is a graph, showing a relationship between the number of applications of the program voltage and the memory cell whose write operation is completed by the application of the program voltage.

As shown in FIG. 13, when memory cell transistor MT repeats the write or erase operation, the number of programs needed for the write operation of data changes. Specifically, tunnel insulating film 204 of memory cell transistor MT is damaged by the FN current during the write or erase operation. As a result, for example, the Si—O bond, which constitutes tunnel insulating film 204 of memory cell transistor MT, deteriorates, creating a trap site within tunnel insulating film 204. In this way, if a trap site is formed within tunnel insulating film 204, electrons are trapped in the trap site, causing a problem in which the necessary number of applications of the program voltage decreases and the necessary number of applications of the erase voltage increases.

Therefore, during the certification examination of semiconductor memory device 10-1, the number of write or erase operations that has a probability of causing problems is calculated. For example, if the number of write or erase operations is between 0 and 1000, the least number of program operations needed for the write operation is S+1, and the greatest number of program operations is S+x (see the distribution of state A in the figure). Additionally, for example, if the number of write or erase operations is between 1001 and 2000, the least number of program operations needed for the write operation is S, and the greatest number of program operation is S+4 (see the distribution of state B in the figure). Furthermore, for example, if the number of write or erase operations is between 2001 and 3000, the least number of program operations needed for the write operation is S−1, and the greatest number of program operation is S+3 (see the distribution of state C in the figure).

In this way, if the write or erase operation to memory cell transistor MT is repeated more than the specified number of times, the distribution between the number of programs and the normal memory cells into which data has been already written for the number of programs changes. While not shown in this figure, if the number of write and erase operations further increases, the distribution in the normal memory cells will change further.

Here, in case the number of write or erase operations is 2001 or more, if the first preset count (S times), as set in ROM fuse area 11-1, is not changed, for example, when the program is executed for S−1 times, data are sometimes written into the selected cell. If the verifying operation is set to be executed after the program operation has been executed for S times, an unnecessary program voltage will be applied to the selected cell that has completed the write operation. As a result, there is a possibility that that selected cell is over-programmed (i.e., excessive write).

In order to prevent such over-programming, when the number of write or erase operations has reached the count at which the distribution of the memory cells changes (second preset count), control circuit 16 resets the first preset count (i.e., the first preset count corresponding to the memory cell transistor MT that has reached to the second preset count), as stored in ROM fuse area 11-1, to an appropriate value.

In this way, in this embodiment, when the number of write and erase operations has reached the second preset count, the loop counts (the first preset count) of programs will be reduced, in the subsequent operations. Consequently, it becomes possible to suppress the occurrence of over-programming.

Here, this updated first preset count is calculated by the certification examination of the semiconductor memory device and others. Also, the second preset count is, for example, "1000" and "2000."

Third Embodiment

The semiconductor memory device according to a third embodiment will be explained. In the first and second embodiments, the write operation is explained. In the third embodiment, the erase operation of the selected cell will be explained. Here, since the basic structures and so on of the semiconductor memory device of the third embodiment are the same as those explained in the previous embodiments, duplicative detailed explanations have been omitted.

<3.1 Operation>

<3.1.2 Erase Operation of Semiconductor Memory Device of Third Embodiment>

As previously mentioned, erasing data is executed all together to all the memory cell transistors MT that are connected to the same row (one block). In the following, the operation in which the threshold value of memory cell transistor MT is reduced by extracting electrons from the electric charge accumulation layer to the substrate through tunnel insulating film, which is done by creating a potential difference between the control gate and the channel, is called "erase." With multiple executions of this erase operation, the threshold value of memory cell transistor MT is lowered to a desired value, and the data erasing operation is executed. Also, to the well (semiconductor substrate) to which memory cell transistor MT is connected, the erase voltage is applied multiple times. As discussed later, this erase voltage becomes greater for the number of applications when applied repeatedly. When the erase voltage shown below is not distinguished, it will be simply called the erase voltage $V_{ERA}$.

Figure 14:
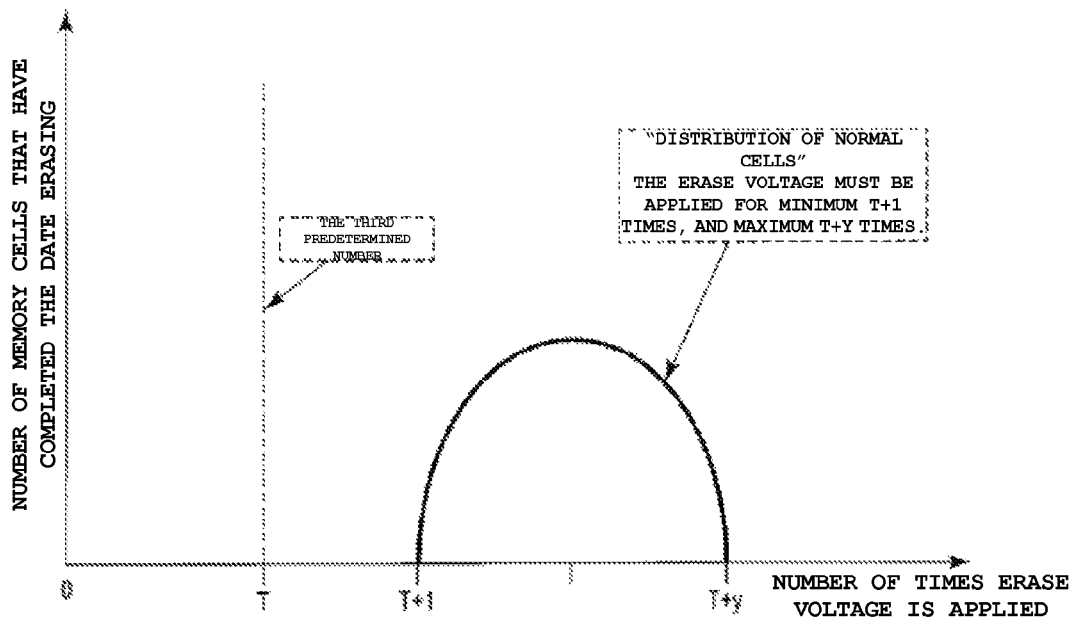
FIG. 14 is a graph, showing a relationship between the number of applications of the erase voltage and the memory cell whose erase operation is completed by the application of the erase voltage.

As shown in FIG. 14, by conducting an experiment in advance for erasing data from the semiconductor memory device, when control circuit 16 executes the erase operation to the normal memory cell transistor, the result may show that the smallest count at which data can be erased from the normal memory cell transistor is T+1, and the greatest count is T+y (y is an integer of 1 or greater.) In this case, ROM fuse area 11-1 stores the number of applications of the erase voltage for which data are not yet erased from the normal memory cell transistor as the third preset count (erase loop count). In the case of this embodiment, ROM fuse area 11-1 stores T times, which is one less than the least number at which data are erased from the normal memory cell transistor, as the third preset count. Here, the third preset count is basically the number of applications of the erase voltage for which data have not yet been erased from the normal memory cell transistor. However, for example, the third preset count can be the least number of applications for which data are erased from the normal memory cell transistor.

<3.1.2 Concrete Example of Erase Operation of Semiconductor Memory Device According to the Third Embodiment>

Figure 15:
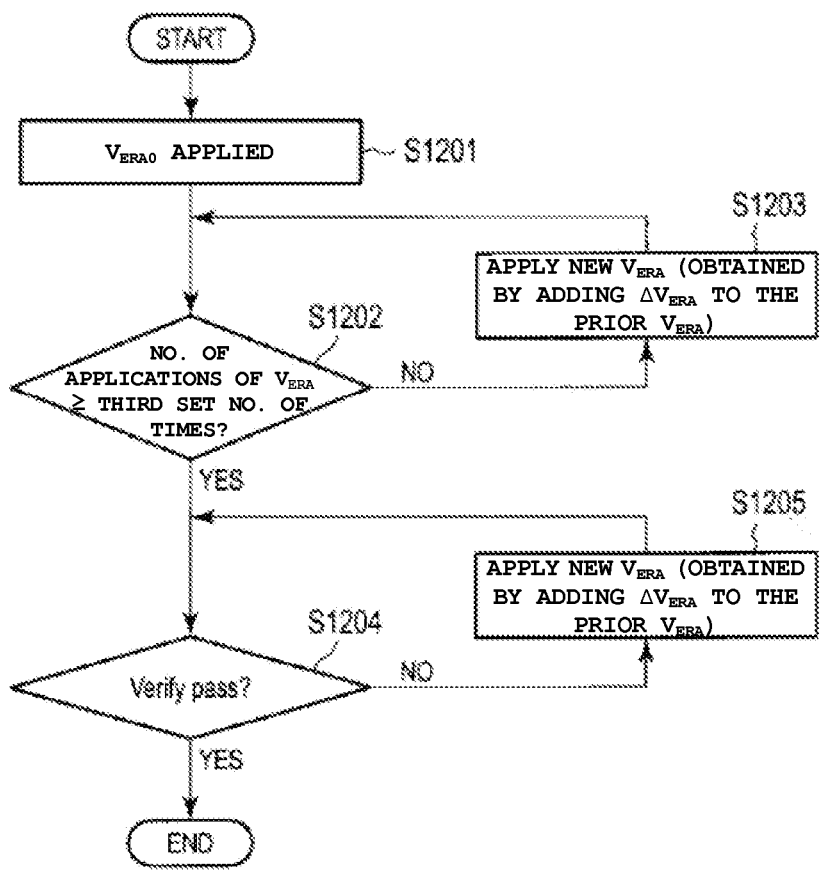
FIG. 15 is a flow chart that shows a general explanation regarding the operation during the data erasing of the NAND-type flash memory according to a third embodiment.

The erase operation of the semiconductor memory device according to the third embodiment will be explained using FIGS. 15 and 16. FIG. 15 is a flow chart that briefly explains the erase operation of the semiconductor memory device according to this embodiment.

Figure 16:
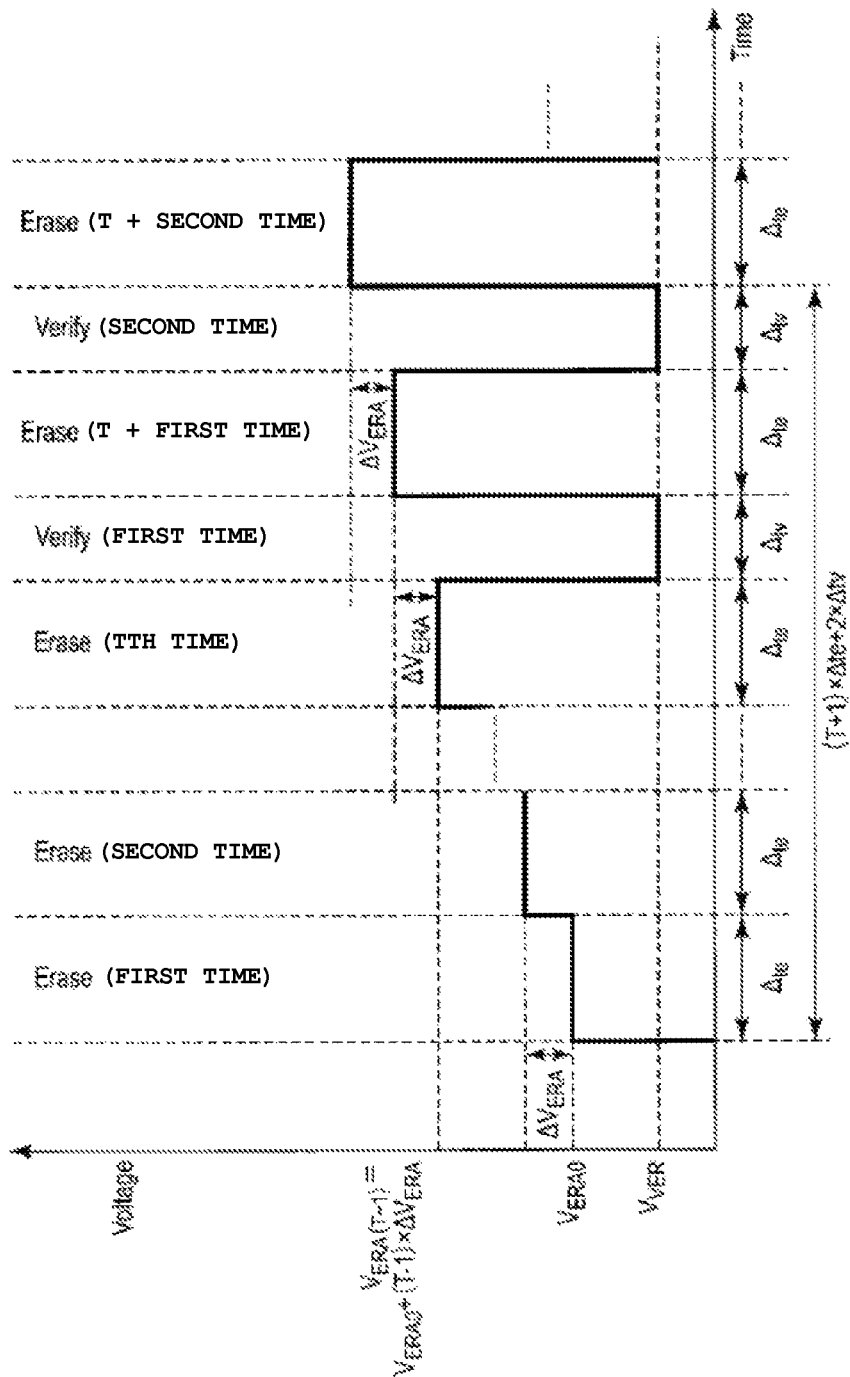
FIG. 16 is a graph, schematically showing an application method of an erase voltage of the NAND-type flash memory according to the third embodiment.

In FIG. 16, $V_{ERA0}$ through $V_{ERA\,(T-1)}$ show the erase voltages of the first time through the Tth time, respectively. The value of the erase voltage $V_{ERA0}$ corresponds to the initial value of the erase voltage according to the loop count. Also, $\Delta V_{ERA}$ corresponds to the increment of the erase voltage according to the loop count. In this embodiment, $\Delta V_{ERA}$ is set at a value that does not depend on the loop count.

[Step S1201]

The control circuit 16 applies the initial erase voltage $V_{ERA0}$ during period $\Delta$te through well control circuit 19 connected to the well of all the bits (i.e., all the memory cell transistors MT) subject to the erase operation. The amount of this erase voltage $V_{ERA0}$ is set in ROM fuse area 11-1.

[Step S1202]

Next, the control circuit 16 determines whether or not the number of applications of the erase voltage $V_{ERA}$ has reached T (the third preset count), as set in ROM fuse area 11-1.

[Step S1203]

At step S1203, if the control circuit 16 determines that the number of applications of erase voltage $V_{ERA}$ (for example, X times (X is an integer of 1 or greater)) has not reached T (T is an integer of 1 or greater), it applies the erase voltage $V_{ERAX}$ (=$V_{ERA(X-1)}+\Delta V_{ERA}$), which can be obtained by adding (increase the voltage for) $\Delta V_{ERA}$ to the Xth erase voltage $V_{ERA\,(X-1)}$, to the well, through well control circuit 19. After that, control circuit 16 again executes step S1202.

[Step S1204]

At step S1202, if the control circuit 16 determined that the number of applications of the erase voltage has reached T times, it confirms whether or not the threshold voltage of these bits is lower than the erase verification voltage. In other words, control circuit 16 executes the verifying operation to the selected cell in block during period $\Delta$tv. Control circuit 16 determines whether or not data have been erased for the selected cell by executing this verifying operation and determines whether it has passed or failed. Specifically, control circuit 16 makes the determination by applying the erase verification voltage $V_{ERA}$ to the well through well control circuit 19.

If the control circuit 16 determines that the threshold voltage of all these bits is lower than the erase verification voltage, it completes the erase operation. In other words, at step S1004, if control circuit 16 determines through the verifying operation that the selected cell has passed (i.e., determines that data have been erased from the selected cell), control circuit 16 terminates the erase operation to the selected cell.

[Step S1205]

At step S1204, if the control circuit 16 determines through the verifying operation that all the bits or residual bits have failed (i.e., determines that data have not been erased from the selected cell), control circuit 16 applies the erase voltage $V_{ERAY(=VERA(Y-1)}+\Delta V_{ERA})$. In other words, if there are bits whose threshold voltage is not lower than the erase verification voltage (namely, residual bits), control circuit 16 applies the erase voltage $V_{ERAY}$(=$V_{ERA(Y-1)+\Delta VERA}$), which can be obtained by adding (increasing voltage for) the increment voltage $\Delta V_{ERA}$ to the erase voltage at the Yth time (an integer of S or greater) $V_{ERA(Y-1)}$, to the well through well control circuit 19. After that, it again executes step S1204.

Additionally, if the threshold voltage of all the remain bits is lower than the erase verification voltage, it terminates the erase operation.

<3.2 Effects of Semiconductor Memory Device According to the Third Embodiment>

In this embodiment, fuse area 11-1 further retains the third preset count. Control circuit 16, when erasing the data from the memory cell MT selected from multiple memory cells MT, keeps applying the erase voltage, which increases each time incrementally by a specified amount according to the number of applications, to semiconductor substrate 202 on which the selected memory cell MT is provided, until it reaches the third preset count. The control circuit 16 also executes the verifying operation to the selected memory cell MT when the number of applications of the erase voltage to semiconductor substrate 202 has reached the third preset count. The control circuit 16 also applies the erase voltage to substrate 202 if it determines through the verifying operation that data are still left in the selected memory cell MT.

In this way, the semiconductor memory device explained in the third embodiment skips the verifying operation during the step-up erase operation and makes the pulse waveform (erase voltage) step-wise. In other words, in the erase operation, it does not execute the verifying operation until it reaches an optional count, and it keeps applying the erase voltage continuously in increments.

Next, the erase operation of a conventional NAND-type flash memory will be explained using FIG. 17.

Figure 17:
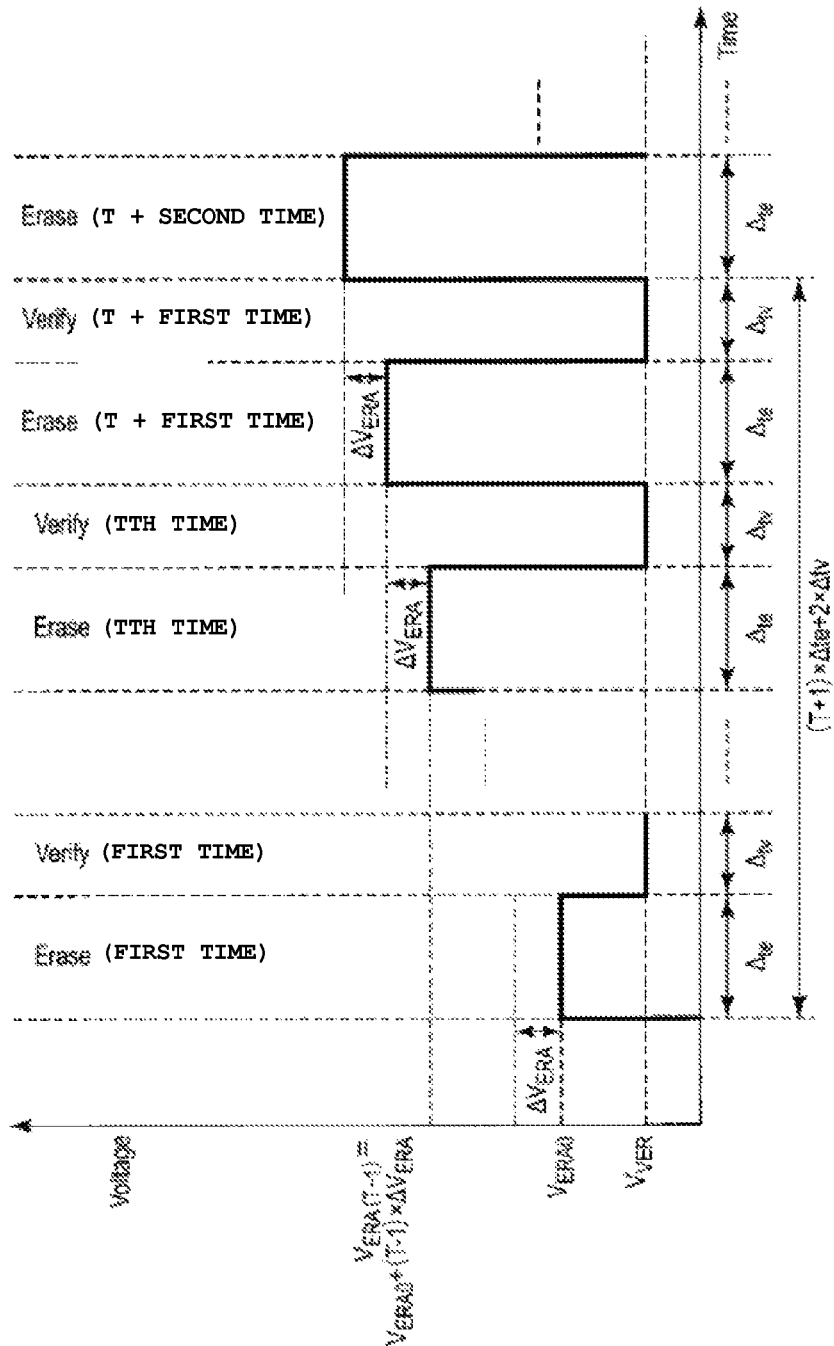
FIG. 17 is a graph, schematically showing the application method of the erase voltage of a conventional NAND-type flash memory.

As shown in FIG. 17, in the erase operation of the comparative example, the control part repeats the erase and verifying operations until data have been erased from the bit. Specifically, the control part executes the verifying operation after the first erase operation. If the control part determines that a failure has occurred, it applies the erase voltage for the second time, using the erase voltage (second time) $V_{ERA1}$, which is obtained by adding $\Delta V_{ERA}$ to the erase voltage (first time) $V_{ERA0}$. The control part repeats the verifying operations until it determines that it has passed.

However, in the data erase operation according to the third embodiment, it is set in such a way as data cannot be erased from the normal memory cell for T times, so the least number of applications of the erase voltage that data can be erased from the memory cell is T+1. As a result, the time needed to complete the erase operation from the bit by the T+1th application of the erase voltage is, (T+1)×$\Delta$te+2×$\Delta$tv, taking into consideration the time needed for the verifying operation after the T+1th erase (second time). However, as in the comparative example, if the verifying operation is executed right after each application of the erase voltage, the time needed is (T+1)×($\Delta$te+$\Delta$tv). This is longer than the write operation described in the third embodiment by (T−1)×$\Delta$tv.

In this way, the time needed for the erase operation can be significantly shortened by executing the erase operation continuously for the number of times that data have not yet been erased from the normal memory cell, which can be done by conducting an experiment and so on in advance, and then by executing the verifying operation after that.

According to the third embodiment, since the duration for the data erasing time can be shortened, it is also possible to execute a more reliable write operation using the saved time to write more slowly by, for example, decreasing the initial erase voltage or step-up increments. The following explains this concept more concretely.

The saved time during the verifying operation of this embodiment can be also used for the erase operation. For example, it is possible to make the erase voltage V ERA0, applied to the well at the beginning of the erase operation, smaller than the erase voltage V ERA0 of this embodiment. This may cause the increase in the number of applications needed for the data to be erased from a memory cell. However, the smaller the program voltage $V_{ERA0}$ is, the more the damage to tunnel insulating film 204 (see FIG. 5) of memory cell transistor MT can be suppressed.

By using this embodiment, it is also possible to make the value of $\Delta V_{ERA}$ (step-up increments) less than the conventional value. In this case, too, as in the previously described case, the number of applications of the erase voltage will increase, but the damage to tunnel insulating film 204 of memory cell transistor MT can be suppressed.

Variation Examples and Others

Here, as explained in the second embodiment, even if semiconductor memory device 10-1 is not equipped with loop counter 16-2, it is possible to achieve the same effect as the second embodiment by using an external counter instrument to execute such a control as explained in the second embodiment.

The loop counter and the explanation in the second embodiment can also be applied to the erase operation described in the third embodiment. Specifically, when the write or erase operation is repeated, sometimes the number of applications of erase voltage needed to erase data increases as trap sites in the tunnel insulating film increase. In such a case, by using the second preset count, as explained in the second embodiment, for example, as in step S1102 in FIG. 12, if the number of writes or erases is equal to the second preset count, control circuit 16 can reset the value that is obtained by adding one to the third preset count currently stored in ROM fuse area 11-1, as the third preset count.

Also, in the second embodiment, the explanations are made based on the premise that the writing and erasing numbers to and from the memory cell will be counted, but it is not necessarily limited to this. For example, the same operation can be executed based on the total number of the step-ups (increased number) that control circuit 16 has executed and so on.

Additionally, the distribution chart regarding the memory cell transistors of each embodiment is based on the assumption that the memory cell transistors are normal. So, it is not necessary to take into consideration the memory cell transistors determined as defective during a quality test and so on.

Also, for the electric charge accumulation layer of memory cell transistor MT, conductive materials can be used, or electric charge trap-type insulating films can also be used.

While certain embodiments have been described, these embodiments have been presented by way of example only, and they are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of memory cells; and
a control circuit configured to apply a program voltage of an initial level to a first line electrically connected to a control electrode of a selected memory cell, and then of an increased level a number of times, each time without decreasing the program voltage applied to the first line, and execute a first verifying operation to apply a voltage that is lower than the program voltage of the initial level to the first line when the program voltage has been increased a first number of times.

2. The semiconductor memory device according to claim 1, wherein the control circuit is configured to further increase the program voltage applied to the first line after executing the first verifying operation on the selected memory cell.

3. The semiconductor memory device according to claim 2, wherein each time the program voltage is increased, the program voltage is increased by substantially the same amount.

4. The semiconductor memory device according to claim 1, further comprising a fuse area in which a third number indicating the first number of times the program voltage should be increased for a data write operation, is stored.

5. The semiconductor memory device according to claim 4, wherein the fuse area further stores a second number, and the control circuit is configured to decrease the third number stored in the fuse area by one, if a number of data write and data erase operations equal the second number.

6. The semiconductor memory device according to claim 5, wherein the control circuit is configured to apply an erase voltage of an initial level to the first line and then of an increased level a number of times, each time without decreasing the erase voltage applied to the first line, prior to executing second verifying operation on the selected memory cell.

7. The semiconductor memory device according to claim 6, wherein the control circuit is configured to execute the second verifying operation when the erase voltage has been increased a second number of times.

8. The semiconductor memory device according to claim 7, wherein a voltage applied to the first line during the second verifying operation is lower than the erase voltage of the initial level.

9. The semiconductor memory device according to claim 8, wherein the control circuit is configured to further increase the erase voltage applied to the first line after executing the second verifying operation on the selected memory cell.

10. A control method for a semiconductor memory device having a plurality of memory cells, the method comprising:
applying a program voltage of an initial level to a first line electrically connected to a control electrode of a selected memory cell, and then of an increased level a number of times without decreasing the program voltage applied to the first line; and
executing a verifying operation to apply a voltage that is lower than the program voltage of the initial level to the first line when the program voltage has been increased a first number of times.

11. The control method of claim 10, further comprising:
applying the program voltage to the first line of a further increased level first line after executing the verifying operation on the selected memory cell.

12. The control method of claim 10, wherein each time the program voltage is increased, the program voltage is increased by substantially the same amount.

13. The control method of claim 10, further comprising:
storing the first number indicating how many times the program voltage should be increased prior to performing the verifying operation.

14. A control method for a semiconductor memory device having a plurality of memory cells, the method comprising:
applying an erase voltage of an initial level to a first line electrically connected to a control electrode of a selected memory cell, and then of an increased level a number of times without decreasing the erase voltage applied to the first line; and executing a verifying operation to apply a voltage that is lower than the erase voltage of the initial level to the first line when the erase voltage has been increased a first number of times.

15. The control method of claim 14, further comprising:
applying the erase voltage to the first line of a further increased level first line after executing the verifying operation on the selected memory cell.

16. The control method of claim 14, further comprising:
applying a program voltage of an initial level to the first line and then of an increased level a number of times, each time without decreasing the program voltage applied to the first line, prior to executing the verifying operation on the selected memory cell.

17. The control method of claim 16, further comprising:
storing a second number indicating how many times the erase voltage should be increased prior to performing the verifying operation; and decreasing the second number when a number of data write and erase operations on the selected memory cell equal the first number.

18. The control method of claim 14, further comprising:
storing the first number indicating how many times the erase voltage should be increased prior to performing the verifying operation.

19. A semiconductor memory device, comprising:
a plurality of memory cells; and
a control circuit configured to perform a first write operation, the first write operation including a first program operation, a second program operation, and a first verifying operation, the control circuit being configured to apply a first program voltage to a first line in the first program operation and then apply a second program voltage to the first line without decreasing a program voltage applied to the first line in the second program operation, the second program voltage being higher than the first program voltage, and the control circuit being configured to apply a first verify voltage to the first line in the first verifying operation, the first verify voltage being lower than the first program voltage.

20. The semiconductor memory device according to claim 19, wherein the control circuit configured to perform a second write operation including a third program operation after the first verifying operation, the control circuit being configured to apply a third program voltage to the first line in the third program operation, the third program voltage being higher than the second program voltage.

21. The semiconductor memory device according to claim 20, wherein a difference between the first program voltage and the second program voltage is substantially the same as a difference between the second program voltage and the third program voltage.

22. The semiconductor memory device according to claim 19, wherein the control circuit is configured to perform an erase operation including a first operation, a second operation and a second verifying operation, the control circuit being configured to apply a first erase voltage to the first line in the first operation and then apply a second erase voltage to the first line without decreasing an erase voltage applied to the first line in the second operation, and the control circuit being configured to apply a second verify voltage to the first line in the second verifying operation, the second verify voltage being lower than the first erase voltage.

23. The semiconductor memory device according to claim 22, wherein the first erase voltage is lower than the second erase voltage.

24. The semiconductor memory device according to claim 23, wherein the control circuit configured to perform a second erase operation including a third erase operation after the second verifying operation, the control circuit being configured to apply a third erase voltage to the first line in the third operation, the third erase voltage being higher than the second erase voltage.

25. The semiconductor memory device according to claim 24, wherein a difference between the first erase voltage and the second erase voltage is substantially the same as a difference between the second erase voltage and the third erase voltage.

* * * * *